(12) United States Patent
Lopez

(10) Patent No.: US 7,932,781 B2
(45) Date of Patent: Apr. 26, 2011

(54) MULTI-PLANAR SOLID STATE AMPLIFIER

(75) Inventor: Noel A. Lopez, Phoenix, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

(21) Appl. No.: 12/437,414

(22) Filed: May 7, 2009

(65) Prior Publication Data

US 2009/0212871 A1 Aug. 27, 2009

Related U.S. Application Data

(63) Continuation of application No. 11/853,897, filed on Sep. 12, 2007, now Pat. No. 7,532,073.

(51) Int. Cl.
*H03F 3/68* (2006.01)
(52) U.S. Cl. ............... 330/295; 330/53; 330/124 R
(58) Field of Classification Search ............ 330/295, 330/53, 124 R
See application file for complete search history.

(56) References Cited

U.S. PATENT DOCUMENTS

| 4,291,278 | A | * | 9/1981 | Quine | 330/286 |
| 4,677,393 | A | * | 6/1987 | Sharma | 330/286 |
| 5,032,798 | A | * | 7/1991 | Myer | 330/295 |
| 5,159,290 | A | * | 10/1992 | Bartley et al. | 330/295 |
| 5,754,402 | A | * | 5/1998 | Matsuzaki et al. | 361/707 |
| 6,242,984 | B1 | * | 6/2001 | Stones et al. | 330/295 |
| 6,525,610 | B1 | * | 2/2003 | Nakata | 330/286 |

* cited by examiner

*Primary Examiner* — Patricia Nguyen
(74) *Attorney, Agent, or Firm* — Snell & Wilmer LLP

(57) ABSTRACT

A solid state power amplifier (SSPA) system may include a radio frequency (RF) input, an RF waveguide split block, multiple monolithic microwave integrated circuit (MMIC) power amplifier modules, and/or a heat spreader. The power amplifier modules and RF waveguide may be distributed about the heat spreader in different planes. Furthermore, the power amplifier modules may be located on opposite sides of the heat spreader and nonplanar to the waveguide split block. A method for dissipating heat within an SSPA may include receiving an RF signal in a first plane, amplifying the RF signal in another plane, and combining the RF signal in yet another plane.

19 Claims, 11 Drawing Sheets

_US 7,932,781 B2_

MULTI-PLANAR SOLID STATE AMPLIFIER

PRIORITY

This application is a continuation of U.S. patent application Ser. No. 11/853,897, filed on Sep. 12, 2007, and entitled "SOLID STATE POWER AMPLIFIER WITH MULTI-PLANAR MMIC MODULES", which is hereby incorporated by reference.

FIELD OF INVENTION

The present invention relates to solid state power amplifiers. More particularly, the invention relates to a solid state power amplifier having, for example, a waveguide split block construction that combines multiple monolithic microwave integrated circuit modules in multiple planes.

BACKGROUND OF THE INVENTION

Solid state power amplifiers (SSPA's) are beneficial when used to amplify relatively weak radio frequency (RF) signals that are communicated with a satellite. The amplified RF signals are then communicated to additional electrical circuitry capable of converting, filtering, and otherwise adapting the original RF signals into signals that are recognizable as images, text, sound, or other useful media. In addition to satellite communication systems, SSPA's may be used in ground-to-ground communication systems such as systems for local multipoint distribution service (LMDS) or in other communications systems capable of achieving various objectives.

SSPA's are relatively reliable systems that include multiple monolithic microwave integrated circuit (MMIC) power amplifiers (PA) typically mounted along a single plane to a heat sink structure that is also planar in shape. The heat sink is capable of dissipating heat away from the MMIC's. MMIC's generate significant amounts of heat which must be dissipated through the heat sink in order to maintain reliability of the SSPA. Planar orientations of MMIC's also provide SSPA's of minimal volume. However, such planar-shaped SSPA's often include an unnecessarily large footprint, which may prove ineffective for certain markets and applications.

For example, mobile satellite communications systems are often placed within vehicles, aircraft, ships, and other mobile transports. Such mobile transports often require reliable communications equipment, yet have very limited and often awkwardly-shaped space available for the installation of such equipment. Many SSPA's capable of providing reliable amplification of RF signals to mobile transports simply would not fit within such transports because of the large, planar size and footprint of the SSPA's.

There is a need for a reliable and low-cost solid state power amplifier that accommodates various size and shape requirements. The invention addresses this and other needs.

SUMMARY OF THE INVENTION

In accordance with an example of a solid state power amplifier (SSPA), a radio frequency (RF) input may be in communication with an RF waveguide split block, multiple monolithic microwave integrated circuit (MMIC) power amplifier modules, and a heat spreader. The RF waveguide split block may include an RF waveguide splitter and an RF waveguide combiner. The RF waveguide splitter is in communication with the RF input. The MMIC power amplifier modules may be arranged in more than one plane, and are placed in communication with the RF waveguide split block. The heat spreader may be in thermal communication with the multiple MMIC power amplifier modules.

An example of an SSPA may include a heat spreader having multiple surfaces along multiple planes, and multiple MMIC power amplifier modules in communication with the multiple surfaces of the heat spreader. Each of the multiple MMIC power amplifier modules may include a backing, a board, an MMIC, and a cover. The board may be mounted on the backing, the MMIC may be mounted upon the backing, and the cover may insulate the MMIC. The backing may provide a thermal path from the MMIC, may include an RF waveguide feed for receiving RF signals, and may include an RF waveguide launch for sending RF signals.

An example of a method for dissipating heat within an SSPA may include receiving an RF signal, splitting the RF signal, amplifying multiple RF signals, combining the multiple RF signals, generating heat from multiple MMIC's, and/or dissipating the heat. Splitting the RF signal may include splitting the RF signal along two planes into multiple RF signals. Amplifying the multiple RF signals may include amplifying the RF signals with MMIC's arranged along two planes. Generating heat from the MMIC's may occur while amplifying the multiple RF signals. Dissipating the heat may include dissipating the heat generated from the two planes of MMIC's into a single heat spreader.

In accordance with an exemplary embodiment, power amplifier modules and an RF waveguide may be distributed about a heat spreader in different planes. Furthermore, the power amplifier modules may be located on opposite sides of the heat spreader and nonplanar to the waveguide split block. An exemplary method for dissipating heat within an SSPA may include receiving an RF signal in a first plane, amplifying the RF signal in another plane, and combining the RF signal in yet another plane.

In another exemplary embodiment, a power amplifier system includes a waveguide splitter, a waveguide combiner, and at least two power amplifier modules. The power amplifier modules each have a MMIC. Furthermore, the power amplifier system includes a heat spreader with at least four sides. The waveguide splitter connects to a first side, the waveguide combiner connects to a second side, opposite the first side. The power amplifier modules are connected to a third and fourth side, respectively. In an exemplary embodiment, the first and second sides are perpendicular to the third and fourth sides.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

Figure 1:
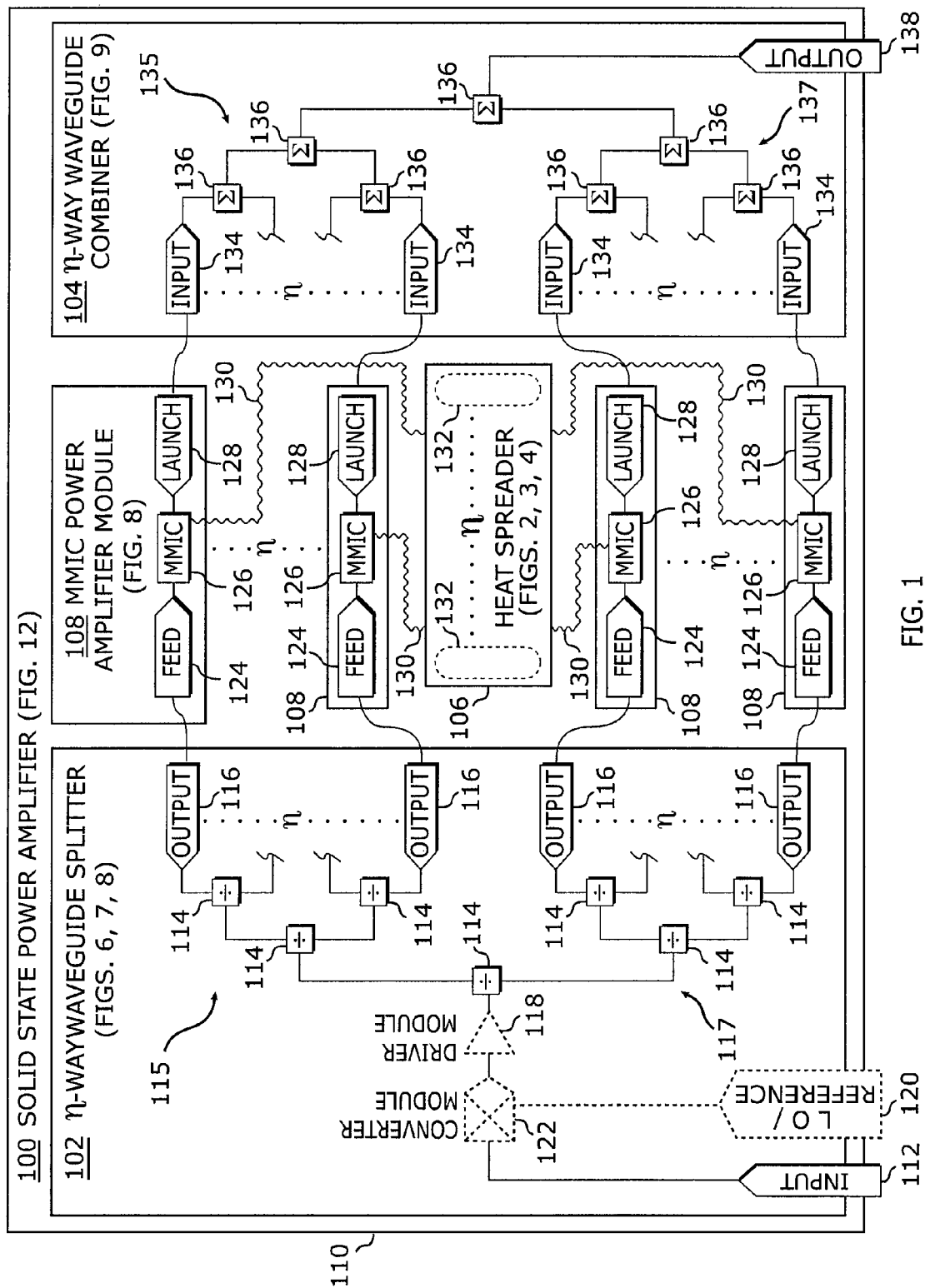
FIG. 1 shows a schematic diagram of an example of a solid state power amplifier ("SSPA")

In accordance with an example of a solid state power amplifier (SSPA), and with reference to FIG. 1, an SSPA 100 includes a radio frequency (RF) waveguide splitter 102, an RF waveguide combiner 104, a heat spreader 106, and multiple monolithic microwave integrated circuit (MMIC) power amplifier modules 108. The RF waveguide splitter 102 and RF waveguide combiner 104 maybe arranged in any orientation within the SSPA 100 and should operate as a single waveguide split block which serves to power combine the multiple MMIC power amplifier modules 108. Alternatives and/or additions to a split block may include any standard waveguide splitter and combiner, coaxial splitters and combiners, and micro-strip splitters and combiners (e.g., where lower frequencies are preferred). The heat spreader 106 communicates with or is located between at least two planes of multiple MMIC power amplifier modules 108 and serves to spread the heat received from MMIC's within the modules 108. In one example of an embodiment, all components of the RF waveguide splitter 102, RF waveguide combiner 104, heat spreader 106, and MMIC power amplifier modules 108 are housed within an electromagnetic interference (EMI) cover 110 that is installed over these electronic components.

The RF waveguide splitter 102 includes an RF input 112 in communication with one or more RF channel splitters 114. The RF channel splitters 114 evenly divide the RF signal into multiple separate RF signals and communicate the multiple RF signals to multiple RF signal outputs 116. Any number of RF channel splitters 114 and corresponding RF signal outputs 116 maybe provided within the RF waveguide splitter 102. For example, in one embodiment, the RF waveguide splitter 102 may include enough RF channel splitters 114 and RF signal outputs 116 in order to split at least one RF signal into between two and thirty-two or four and thirty-two separate RF signals, and, in one embodiment, eight separate signals.

In an example of an embodiment of the RF splitter 102, a driver module 118 may be placed in communication with the RF input 112. The driver 118 serves in this example to increase the overall gain of the SSPA 100 so that less RF input power is required to operate the SSPA 100. In another example of an embodiment of the RF waveguide splitter 102, a local oscillator (LO) reference 120 is placed in communication with a converter module 122 which is in turn placed in communication with the RF input 112. In an example of an SSPA that operates as a receiver, the converter module 122 and LO reference 120 serve to convert the frequency of the RF signal received through the RF input 112 to a lower and more manageable intermediate frequency (IF).

In an example of an embodiment of an SSPA that operates as a transmitter, the RF input 112 may be an IF input, and the converter module 122 and LO reference 120 serve to convert the frequency of an IF signal received through the IF input to a desired RF output signal. In another example of an SSPA, the entire LO chain of components required to produce an LO signal, such as multipliers and phase lock loops, may reside within the SSPA. Where the entire LO chain of components resides within the SSPA, the LO chain can provide LO signal generation, multiplication, and/or referencing within the SSPA without the need of receiving an external LO reference signal.

Both the RF input 112, and the LO reference 120, when used in combination with the RF input 112, may extend through the housing of both the RF waveguide splitter 102 and the cover 110 of the SSPA 100. As shown in FIG. 1, and with continued reference to the RF waveguide splitter 102, the RF channel from the RF input 112 has been split by the RF a channel splitter 114 into two separate groups 115 and 117 of RF channels. The two separate channel groups 115 and 117 form two separate groups of RF signal outputs 116. Each of the RF signal output 116 groups communicates with multiple MMIC power amplifier modules 108.

Each of the multiple MMIC power amplifier modules 108 includes an RF signal feed 124, a monolithic microwave integrated circuit (MMIC) 126, and an RF signal launch 128. Each MMIC power amplifier module 108 also includes a thermal channel 130. Each RF signal feed 124 is capable of receiving an RF signal from a corresponding RF signal output 116 of the RF waveguide splitter 102. The RF signal received by each RF signal feed 124 is then communicated through the MMIC power amplifier module 108 to each respective MMIC 126.

Each respective MMIC 126 then amplifies the RF signal and communicates the amplified RF signal to each respective RF signal launch 128. During amplification of each RF signal, each MMIC 126 generates heat. The heat generated during the RF signal is transferred through each respective thermal channel 130 directly to the heat spreader 106.

The heat spreader 106 may be formed of a material having a high thermal conductivity. For example, the heat spreader 106 may be formed of a material such as aluminum or copper. The heat spreader 106 is capable of receiving heat through the thermal channels 130 associated with each respective MMIC power amplifier module 108 and dissipating the heat received through channels 130 throughout the heat spreader. In an example of one embodiment, the heat spreader 106 may include one or more fluid spaces 132. The one or more fluid spaces 132 may be holes, chambers, or other formations within the heat spreader 106. The fluid spaces 132 may house any fluid such as air, water, oil, or other liquid or gas. Such fluid may flow through and/or circulate within the one or more fluid spaces 132 in order to further dissipate heat of the heat spreader 106.

Multiple fluid spaces 132 may serve to reduce the weight of the heat spreader 106, and thus the weight of the SSPA 100, and provide a combined surface area greater than the surface area provided by only one large fluid space 132. The one or more fluid spaces 132 may be provided in any size, shape, number, orientation, arrangement, and or location within the heat spreader 106 and/or other components of the SSPA 100 in order to achieve any purpose consistent with the claimed invention. For example, a single fluid space 132 may be strategically located to communicate with a single MMIC power amplifier module 108, and thus dissipate the heat from that single module 108 into a space within the heat spreader 106 that appropriately distributes the heat within at least the heat spreader 106 away from other hot areas of the heat spreader 106.

As indicated previously, any number of MMIC power amplifier modules 108 may be provided in an SSPA 100. The total number of MMIC power amplifier modules 108 may correspond with the total number of RF signal outputs 116 of the RF waveguide splitter 102. Similarly, the total number of MMIC power amplifier modules 108 may correspond with a total number of corresponding inputs 134 located within the RF waveguide combiner 104. Each of the multiple inputs 104 communicates with a channel that is combined with at least one other channel using one or more RF channel combiners 136. The multiple RF channel combiners 136 may further combine multiple RF signals into ultimately as few as a single RF signal. The single RF signal may then be communicated from the combiners 136 through a channel to an RF signal output 138.

The multiple RF signal inputs 134 receive the corresponding RF signals from the RF signal launches 128 of each respective MMIC power amplifier module 108. The received and amplified RF signals are then transferred from each RF input 134 and combined through the RF channel combiners 136 to provide a combined RF signal to the output 138 of the RF waveguide combiner 104. The RF signal output 138 may extend through the housing of both the RF waveguide combiner 104 and the cover 110 of the SSPA 100.

As with the two groups 115 and 117 of RF signal outputs 116 of the RF waveguide spreader 102, the RF signal inputs 134 are separated into two separate groups 135 and 137 within the RF waveguide combiner 104. The two separate groups of both the RF signal outputs 116 (that is, groups 115 and 117) and the RF signal inputs 134 (that is, groups 135 and 137) correspond with two separate groups of MMIC power amplifier modules 108. The two separate groups of the MMIC power amplifier modules 108 are located on separate planes, and, in the example shown in FIG. 1, are located on opposite sides of the heat spreader 106. By locating or arranging at least two separate groups of MMIC power amplifier modules 108 on opposite sides of a single heat spreader, the overall size and shape of the SSPA 100 may be modified from a traditional shape to a non-traditional shape. For example, some traditionally-shaped SSPA's have been relatively flat and long amplifiers having a relatively large footprint when placed upon a surface. In contrast, the SSPA 100 may be arranged in a variety of sizes and shapes such as a cube, parallelogram, hexagon, octagon, or other multi-surface structure. Although it may provide an amplifier with a volume larger than some traditional amplifiers, the multi-surface shape of an SSPA 100 may be configured to have a much smaller footprint when placed upon a surface than traditional flat SSPA's. The SSPA 100 may also be arranged in other orientations in order to modify the dimensions of the SSPA 100 for a particular purpose. For example, the SSPA 100 may be configured to provide dimensions capable of allowing the SSPA 100 to be placed within a mobile transport such as a vehicle, aircraft, or ship.

The elements described above with reference to FIG. 1 will now be described in greater structural and functional detail with reference to the following figures.

Figure 2:
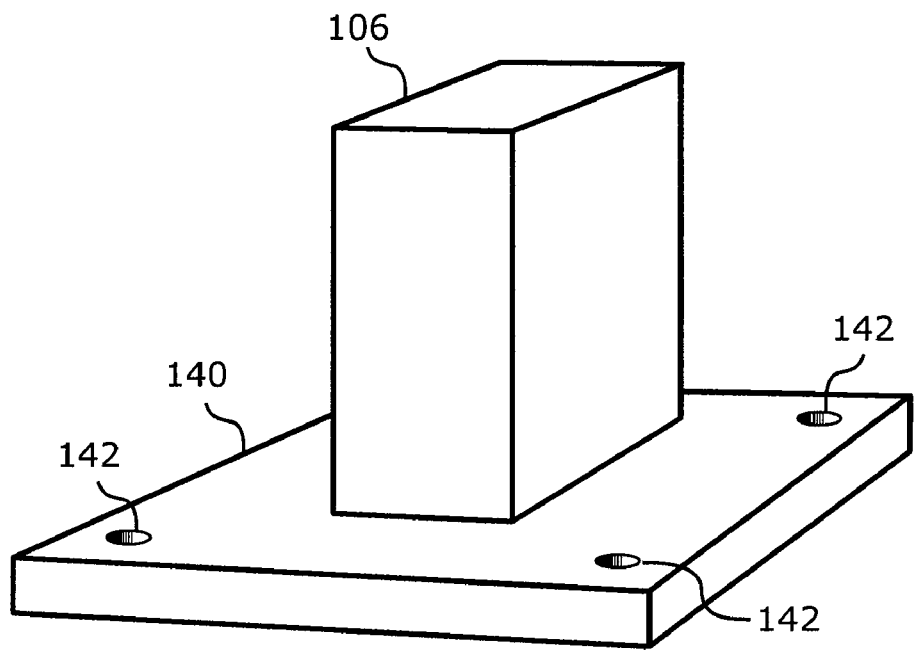
FIG. 2 shows a perspective view of an example of a heat spreader mounted to an example of a base.

Referring to FIG. 2, an example of a heat spreader 106 is shown mounted to a base 140 of an SSPA 100. The heat spreader 106 maybe a single solid piece of thermally conductive material, such as aluminum or copper, as previously described, or any other suitable conductive material. The heat spreader 106 may be mechanically or otherwise secured or attached to the base 140. The cover 110 may be mechanically or otherwise attached to the base 140 such as by sending fasteners through multiple holes 142 in order to pull the bottom surface of the cover 110 against the top surface of the base 140. The base 140 may form the floor of the SSPA 100 to which the cover 110 (FIG. 1) may be attached in order to encompass the electronics within the SSPA 100. The base 140 may be formed of any material consistent with the purposes of the claimed invention, such as a metal, alloy, metal-alloy, polymer, ceramic, or other material. Like the cover 110, the base 140 will, in one embodiment, be environmentally sealed to prevent, for example, moisture or dust from getting into the electronics inside the cube and will serve to prevent electromagnetic interference with the electronics within the SSPA 100 and the environment surrounding the SSPA 100. The cover 110 may be formed of any number of separate components and may be attached to, secured to, combined with, or formed with any other the components of this disclosure in any enabling manner.

Figure 3:
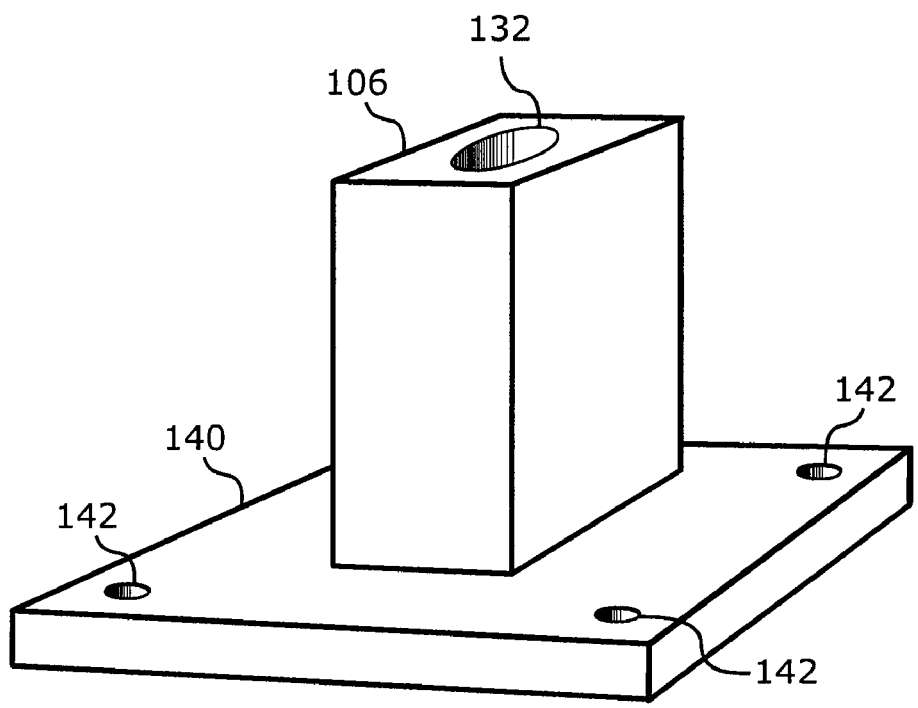
FIG. 3 shows a perspective view of an example of a heat spreader having a single fluid space mounted to an example of a base.

Referring to FIG. 3, an example of an embodiment of a heat spreader 106 is shown mounted on a base 140. Base 140 may, for example, have multiple holes 142 for attachment of a cover 110 to the base 140. The example of the heat spreader 106 includes a single large fluid space 132 through the central long axis of the heat spreader 106. The single fluid space 132 may be configured to reduce the weight and further improve the thermal design of the heat spreader 106 by providing an alternate medium of heat transfer within the heat spreader 106. The single hole 132 would also be very simple to manufacture using molding, drilling, boring, and/or other methods. A corresponding hole may be located within the cover 110 and directly over the single fluid space 132 in order to provide further heat transfer from the heat spreader 106 to the environment outside of the SSPA 100. Additionally and/or alternatively, all or a portion of the single fluid space 132 maybe covered or capped so that a fluid such as air, water, oil, and/or other liquid or gas may be contained and flow within the heat spreader 106 and/or the chamber formed between the enclosed cover 110 and base 140.

Figure 4:
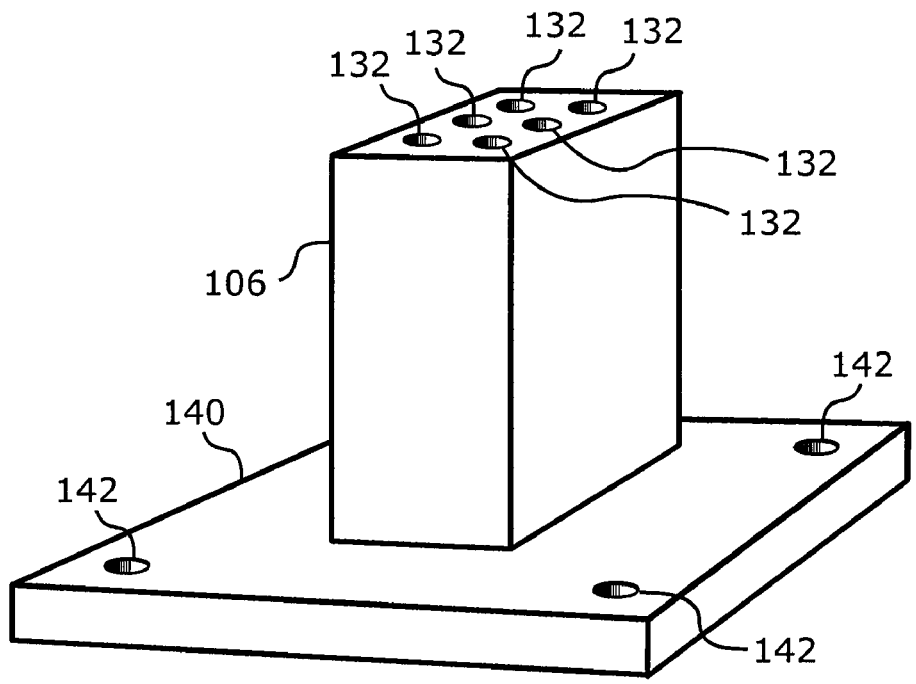
FIG. 4 shows a perspective view of an example of a heat spreader having multiple fluid spaces mounted to an example of a base.

Referring to FIG. 4, an example of an embodiment of a heat spreader 106 is shown mounted to a base 140. Base 140 may, for example, have multiple holes 142 for attachment of the base 140 to a cover 110. The multiple fluid spaces 132 of FIG. 4 may be manufactured using any conventional technique such as those described with reference to the heat spreader 106 of FIG. 3. In this example of a heat spreader 106, multiple fluid spaces 132 are shown formed through the long axis of the heat spreader 106. The multiple fluid spaces 132 of the embodiment described with reference to FIG. 4 may be configured to provide approximately the same amount of fluid space volume as the single fluid space 132 described with reference to FIG. 3. However, in one example of an embodiment the multiple smaller fluid spaces 132 described with reference to FIG. 4 may provide a total combined surface area that interacts with the inside surface of the heat spreader 106 that is greater than the total surface area of the single fluid space 132 described with reference to FIG. 3. Because of the increased amount of surface area, the heat spreader 106 may better transfer and/or dissipate heat through the various surfaces of the multiple fluid spaces 132 and into the fluid located within each respective space 132.

Similar to the embodiment described with reference to FIG. 3, the heat spreader 106 described with reference to FIG. 4 may include open, partially-closed, and/or fully-closed fluid spaces 132 capable of receiving heat from the heat spreader 106, transferring or dissipating heat from the fluid spaces 132 into the larger environment within the SSPA 100, and/or transferring or dissipating heat out one or more holes within the cover 110 of the SSPA 100 and into the environment surrounding the SSPA 100. Manufacturers desiring to isolate the heated fluid from the electrical components within the SSPA 100 may install an environmental seal, such as an o-ring, between the fluid spaces 132 and the cover 110. The environmental seal acts as a fluid barrier between the electronics within the SSPA 100 and both the external environment and the channel formed between the fluid spaces 132 and the cover 110. The environmental seal also serves to channel heated fluid from the fluid spaces 132 to the hole(s) formed within the cover 110 so that the fluid may escape to the environment surrounding the SSPA 100.

Figure 5:
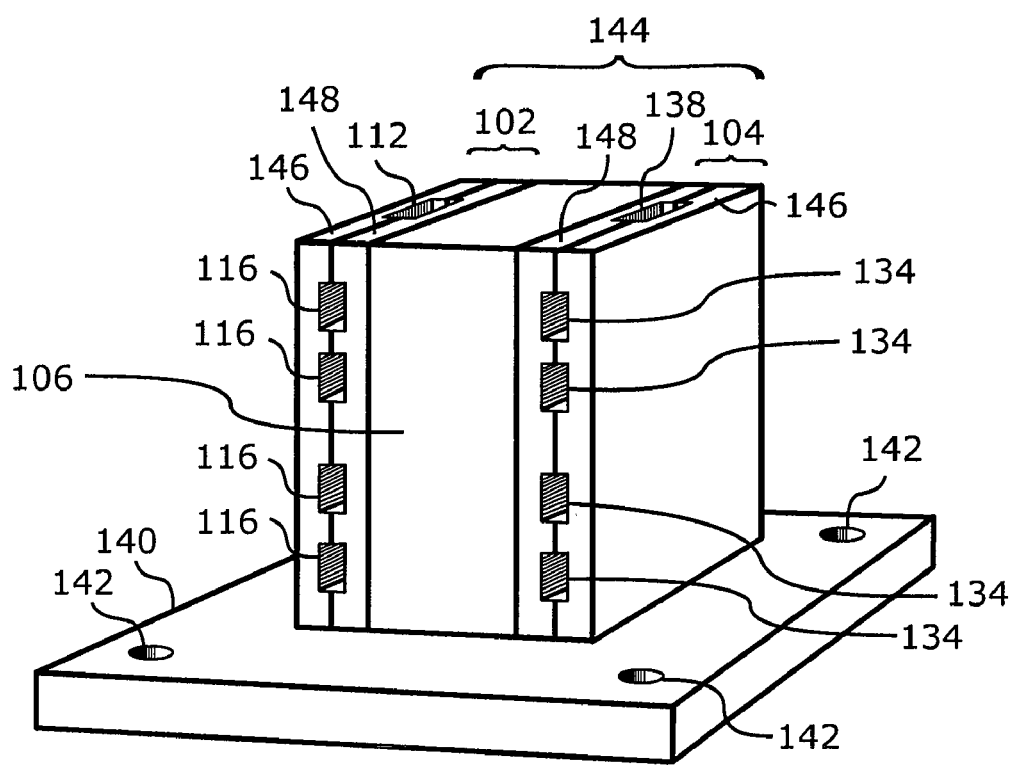
FIG. 5 shows a perspective view of an example of a heat spreader and waveguide block mounted to an example of a base.

Referring to FIG. 5, an example of an embodiment of a heat spreader 106 is mounted to a base 140. Base 140 may, for example, have multiple holes 142 for attachment of a cover 110 to the base 140. In an example of an embodiment, an SSPA 100 includes a wave guide split block 144. Although the split block 144 may have any suitable number of channels, in this example embodiment the SSPA 100 includes an eight-way waveguide split block 144. An eight-way waveguide split block 144 includes an RF waveguide splitter 102 and an RF waveguide combiner 104. In one example embodiment, the RF waveguide splitter 102 and RF waveguide combiner 104 are separated from each other and located on and attached to opposite sides of the heat spreader 106. Both the RF waveguide splitter 102 and the RF waveguide combiner 104 are formed of metal or similar material.

Both the RF waveguide splitter 102 and RF waveguide combiner 104 are formed of split blocks capable of being separated into a first section 146 and a second section 148. The first section 146 and the second section 148 both include grooves within the inner surface of the sections 146 and 148 which, when both sections 146 and 148 are combined, form various splitting and combining channels. The channels form a path through which RF signals may travel between the first section 146 and the second section 148 to either be split into multiple signals within the splitter 102 or to be combined from multiple RF signals into fewer RF signals in the combiner 104. In one embodiment, the channels of both the splitter 102 and combiner 104 are symmetrical with each other such that the splitter 102 and combiner 104 are in phase with each other. Although other shapes may be used, the cubic shape of the heat spreader 106 and cubic orientation of the splitter 102 and combiner 104 permit the channel networks of both the splitter 102 and combiner 104 to be in phase with each other. Thus, other regular shapes with similar advantages may also be used advantageously.

The splitter 102 includes at its top surface, between the first section 146 and the second section 148, an RF signal input 112. The RF waveguide splitter 102 also includes along its front and back surfaces two sets of four channels each terminating at an RF signal output 116. The RF waveguide combiner 104 similarly includes an RF signal output 138 at its top surface between first section 146 and second section 148. The RF waveguide combiner 104 also includes along its front and back surfaces two sets of four channels originating at multiple RF signal inputs 134.

The first section 146 and second section 148 of both the splitter 102 and combiner 104 may be formed as structurally-identical components. Forming these sections as identical parts may be advantageous to manufacturers who desire to simplify the SSPA 100 design and increase the volume of preparing split block parts. By increasing the volume of recurring and replaceable parts within the SSPA 100, a manufacturer can decrease the cost to manufacture the SSPA 100.

Figure 6:
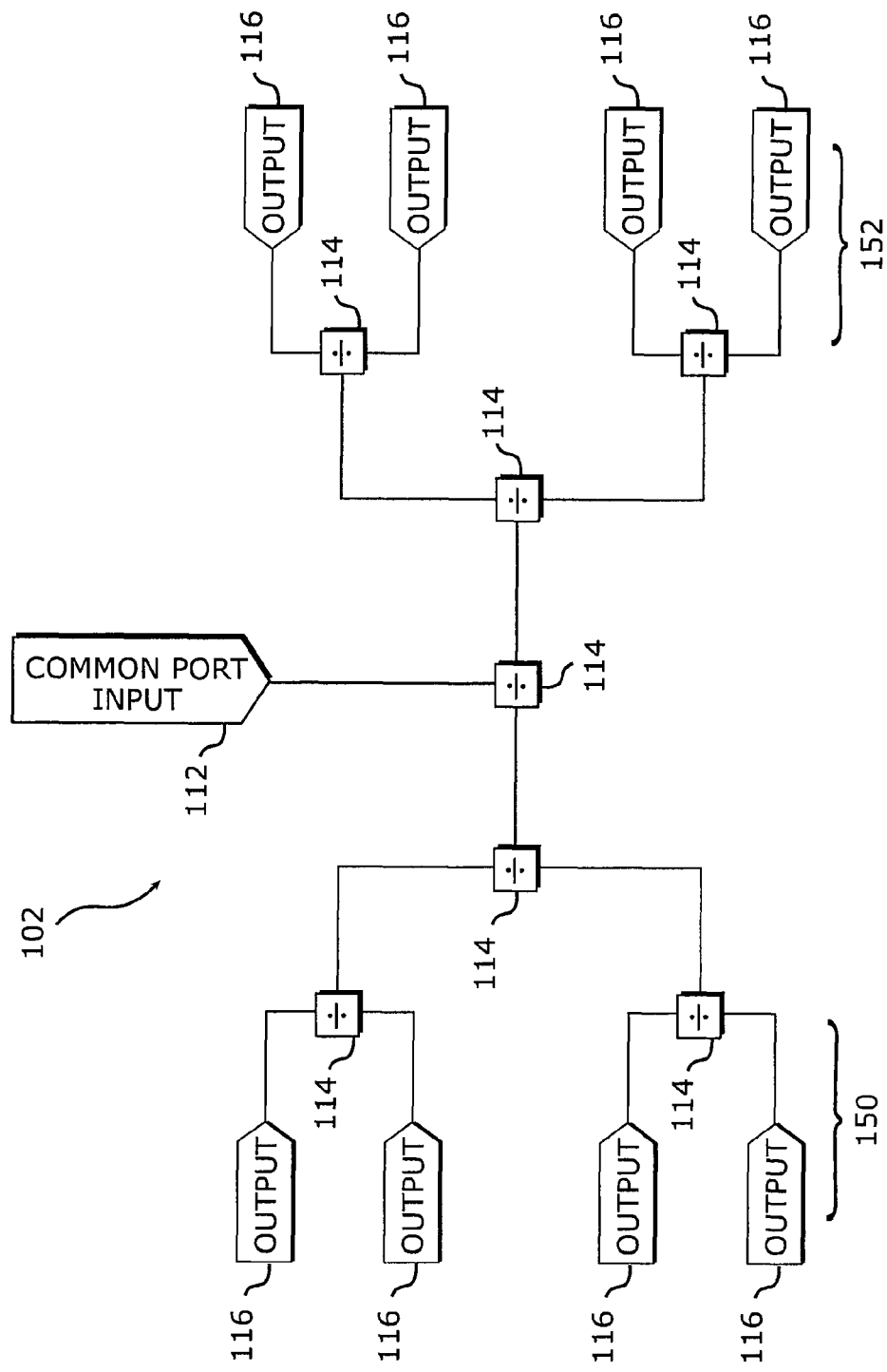
FIG. 6 shows a schematic diagram of an example of an eight-way radio frequency ("RF") waveguide splitter.

Referring to FIG. 6, the eight-way RF waveguide splitter 102 shown mechanically and described with reference to FIG. 5 is shown in FIG. 6 in schematic representation. The eight-way RF waveguide splitter 102 includes an RF signal input 112 that communicates with a series of RF channel splitters or dividers 114 which communicate with each other to split one or more RF signals into multiple RF signals. Ultimately, the multiple RF signals are split by the RF channel splitters 114 into eight separate RF signals that are communicated to a first plane 150 of four RF signal outputs 116 and a second plane 152 of four RF signal outputs 116. The first plane 150 of four RF signal outputs 116 is shown in FIG. 5 on the front surface of the RF waveguide splitter 102. The second plane 152 of the four signal outputs 116 is located on the back surface of the RF waveguide splitter 102 shown in FIG. 5. A total of seven different RF channel splitters 114 are used to split a single RF signal into eight separate signals as shown in the example of the RF waveguide splitter 102 of FIG. 6.

Figure 7:
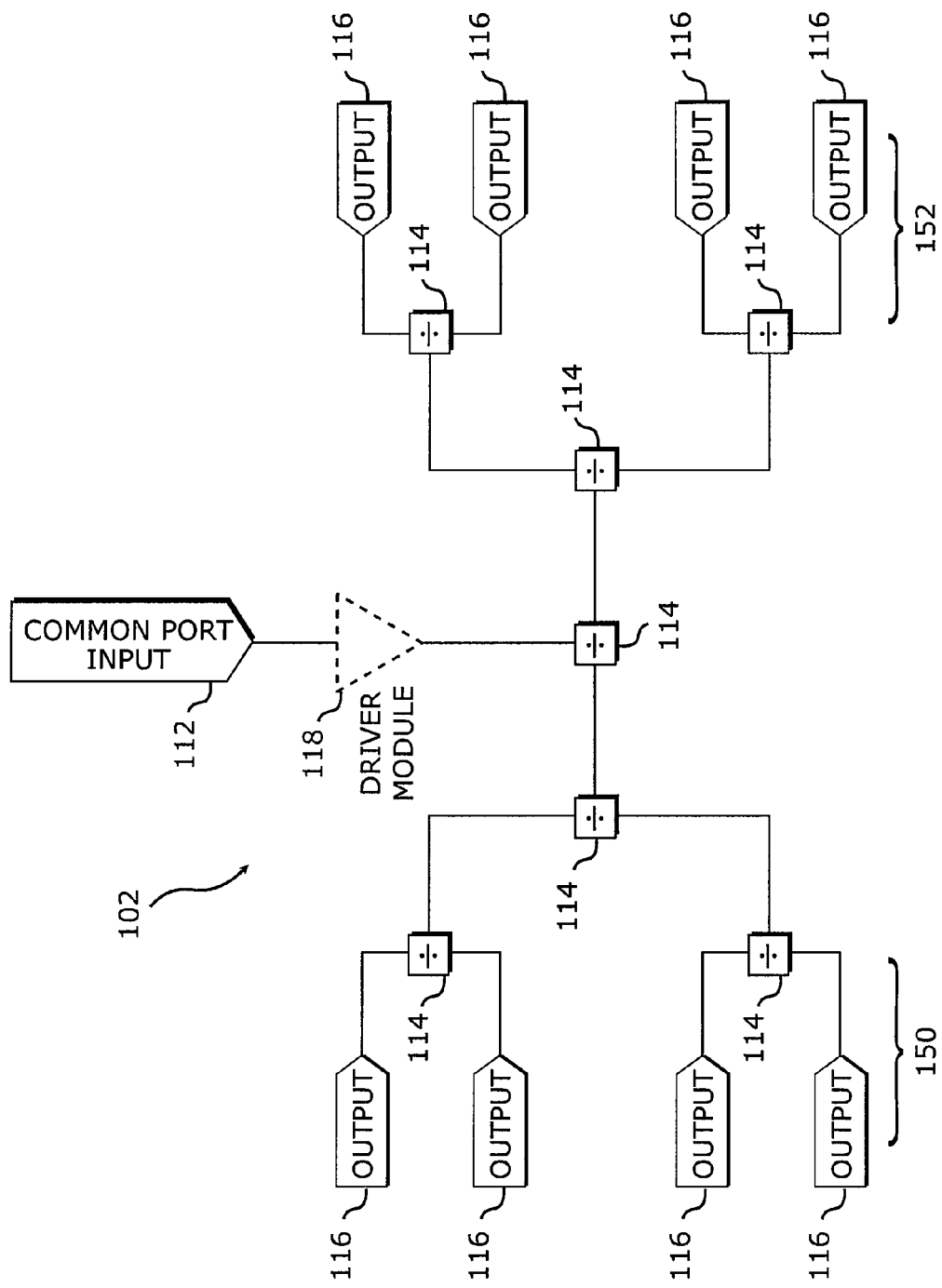
FIG. 7 shows a schematic diagram of an example of an eight-way RF waveguide splitter having a driver module.

Referring to FIG. 7, another example of an RF waveguide splitter 102 includes the components described with reference to FIG. 6 and also includes an optional driver module 118. As described previously with reference to FIG. 1, the driver module 118 may be used in conjunction with the RF signal input 112 and the eight-way waveguide splitter 102 to increase the overall gain of the SSPA 100 so that less RF input power is required to operate the SSPA 100.

Figure 8:
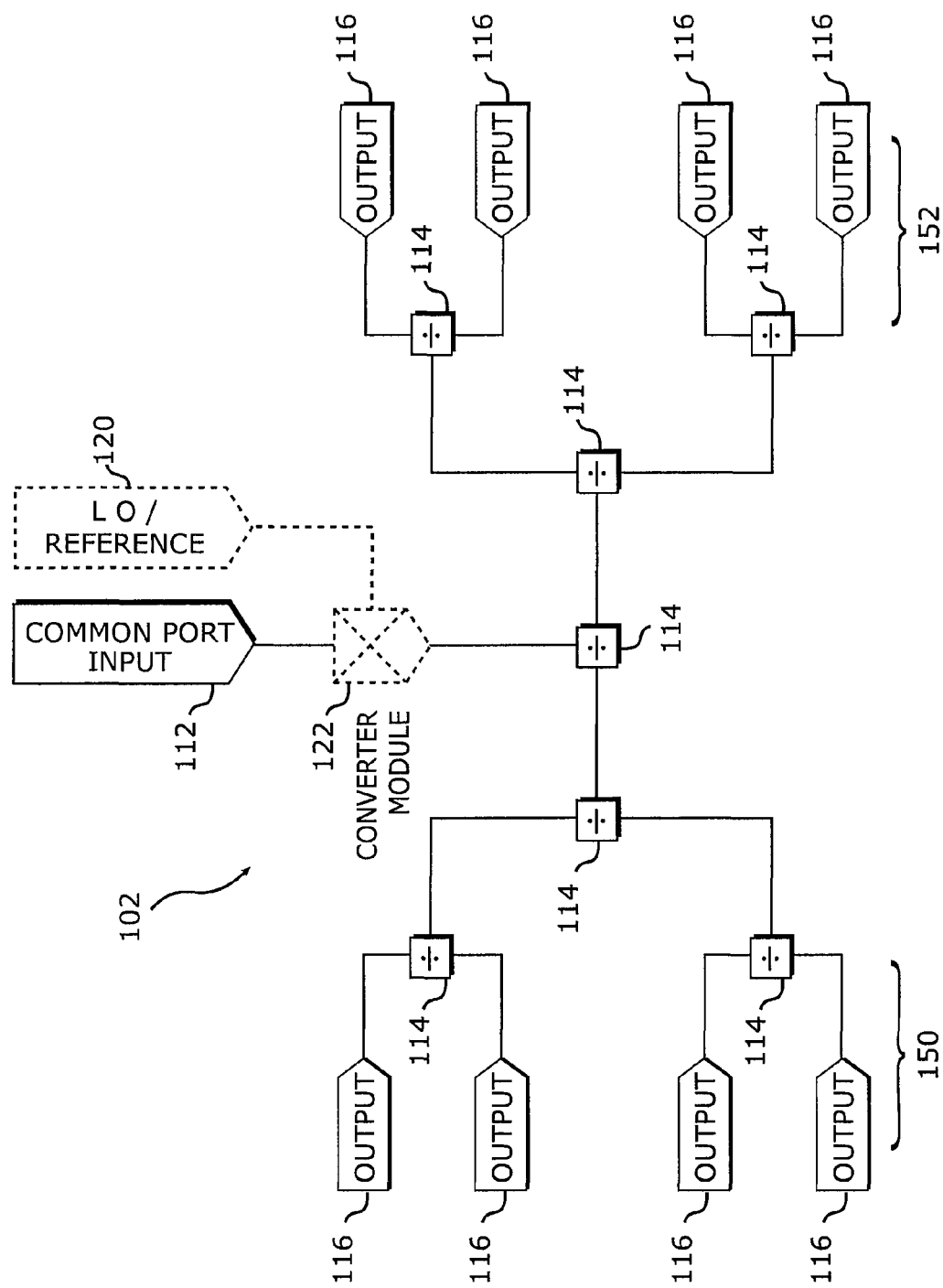
FIG. 8 shows a schematic diagram of an example of an eight-way RF waveguide splitter having a converter module and local oscillator ("LO") reference.

Referring to FIG. 8, another example of an eight-way splitter 102 may include the components described with reference to FIG. 6 and an additional converter module 122 in communication with an LO reference 120. As previously described with reference to FIG. 1, the converter module 122 and LO reference 120 convert the frequency of the inputted RF signal from input 112 to a lower and more manageable intermediate frequency (IF) or, alternatively, from an IF signal to an RF signal.

Figure 9:
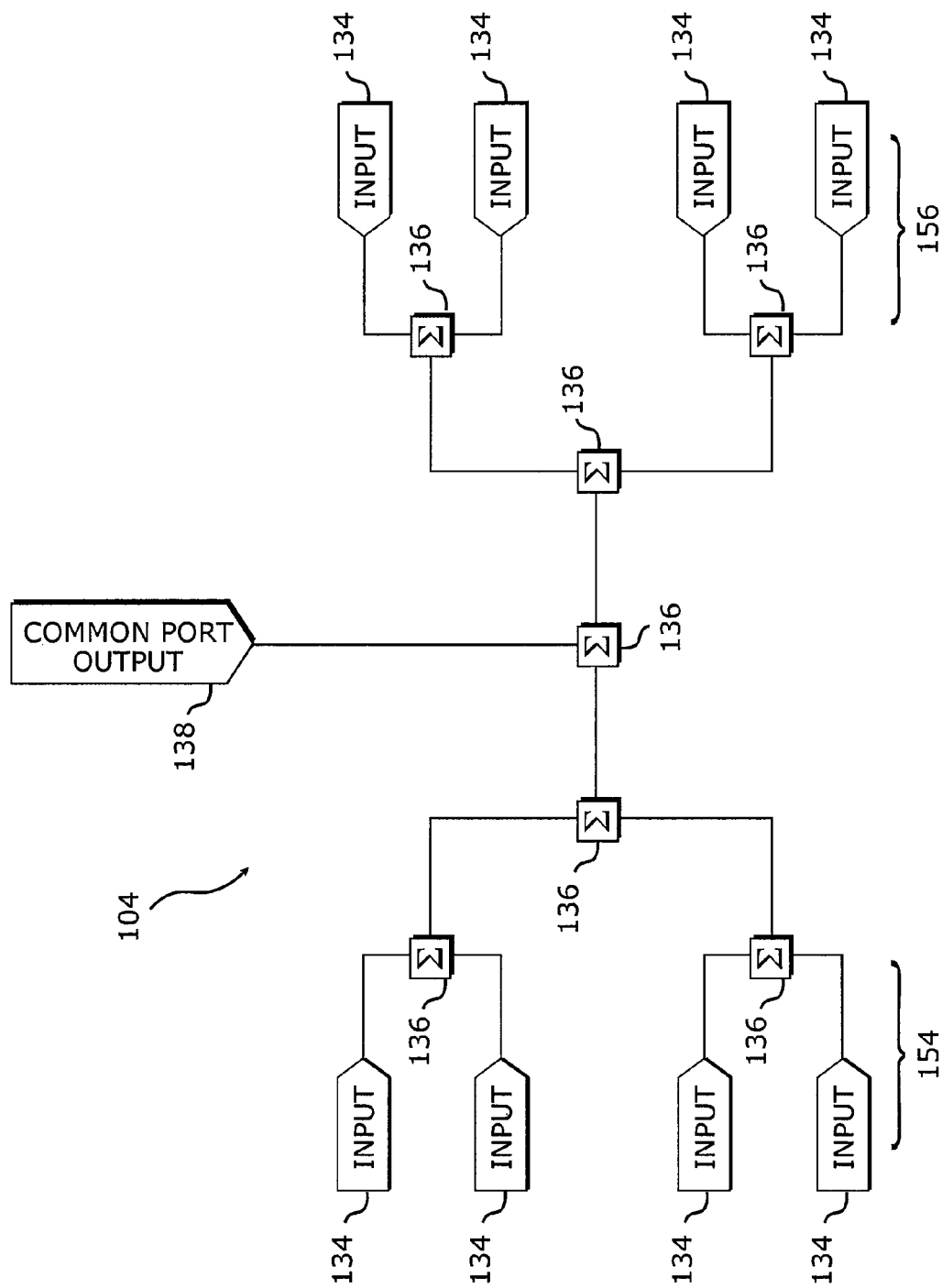
FIG. 9 shows a schematic diagram of an example of an eight-way RF waveguide combiner.

Referring to FIG. 9, the example of an embodiment of an eight-way waveguide combiner 104 described with reference to FIG. 5 is shown in a schematic representation. The eight-way waveguide combiner 104 includes a common output port 138 in communication with multiple RF channel combiners 136 which communicate with each other and with multiple RF signal inputs 134 (FIG. 1). The eight RF signal inputs 134 are separated into two sets of four RF signal inputs 134 along two planes. A first plane 154 includes four RF signal inputs 134 and a second plane 156 includes the other four signal inputs 134. The first plane 154 including four RF signal inputs 134 is shown on the front surface of the eight-way waveguide combiner 104 of FIG. 5, while the second plane 156 of the remaining four RF signal inputs 134 is located on the back side of the eight-way combiner waveguide combiner 104 of FIG. 5.

The eight RF signal inputs 134 of the first plane 154 and second plane 156 of the eight-way waveguide combiner 104 combine eight received and amplified RF signals through a series of seven RF channel combiners in order to provide a single amplified RF signal that is communicated to the common port output 138.

Figure 10:
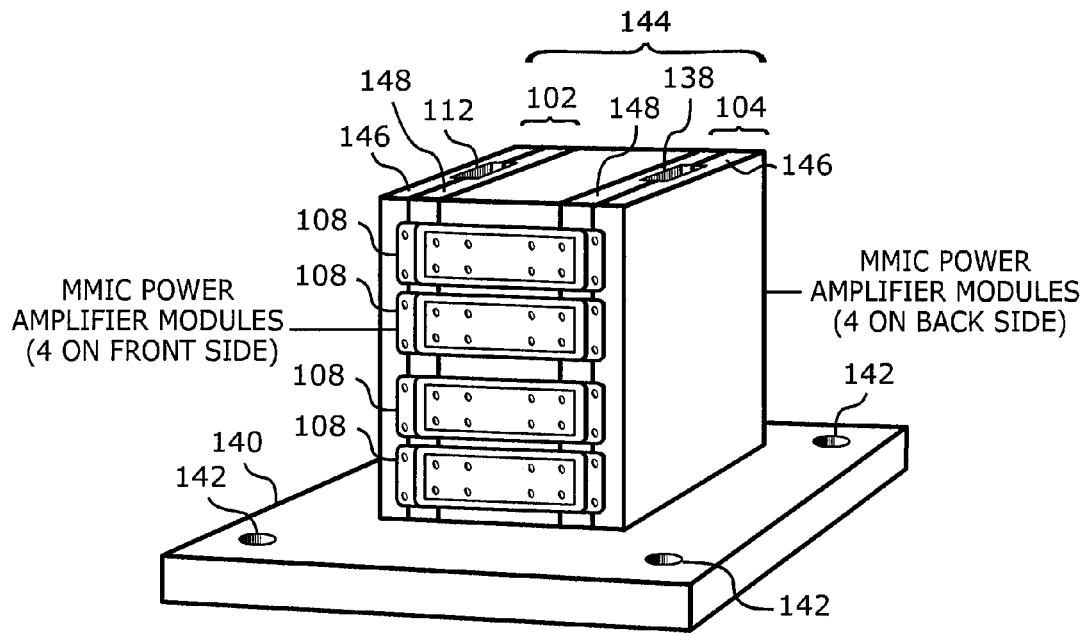
FIG. 10 shows a perspective view of an example of multiple monolithic microwave integrated circuit ("MMIC") power amplifier modules mounted to a waveguide split block and/or heat spreader which are in turn either or both mounted to an example of a base.

Referring to FIG. 10, the example of an embodiment of an eight-way waveguide split block 144 of FIG. 5 is shown with eight MMIC power amplifier modules 108 located on the front side and back side of the split block 144 and the heat spreader 106. The eight separate MMIC power amplifier modules 108 are split into two groups of four modules 108 with four MMIC power amplifier modules 108 located on the front side of the block formed by the waveguide split block 144 and four MMIC power amplifier modules 108 located on the back side of the waveguide split block 144. Each of the separate MMIC power amplifier modules 108 may be attached to the waveguide split block 144, that is either to the first section 146 or second section 148 of either of the splitter 102 or combiner 104, and/or may be attached to the heat spreader 106. Each of the MMIC power amplifier modules 108 aligns a feed 124 with a corresponding RF signal output 116 (FIG. 1) on the splitter 102 and aligns a launch 128 (FIG. 1) with the corresponding RF signal input 134 (FIG. 1) of the combiner 104.

Further, each of the MMIC power amplifier modules 108 aligns its respective thermal path 130 directly between the MMIC 126 of the module 108 and the heat spreader 106. Thus, heat may transfer directly from each MMIC 126 of module 108 and the heat spreader 106. By providing a direct thermal path 130 between the MMIC 126 and the heat spreader 106, the heat transfer and dissipation is localized and controlled within the heat spreader 106 and any fluid spaces 132 with which the heat spreader 106 communicates. By controlling the flow of heat within the SSPA 100, the heat generated from the MMIC's 126 during amplification of the RF signals will not interfere with other necessary electrical operations within the SSPA 100. Thus, by controlling heat flow and dissipation through the heat spreader 106, the reliability of the SSPA 100 is increased.

Figure 11:
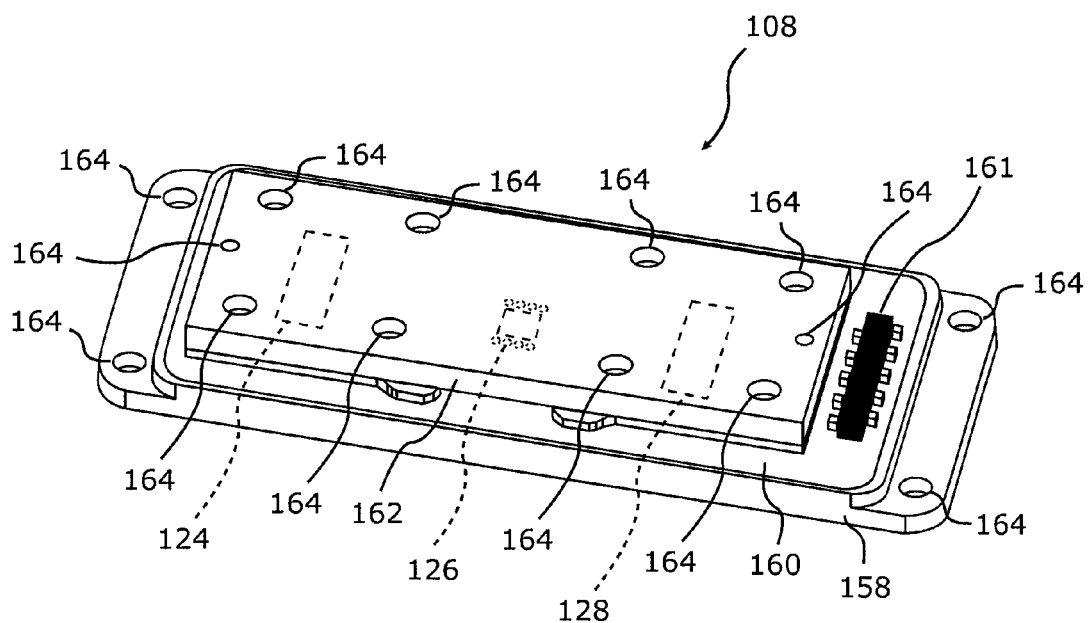
FIG. 11 shows a perspective view of an example of an MMIC power amplifier module.

Referring to FIG. 11, a single MMIC power amplifier module 108 is shown. In this example of an embodiment of an MMIC power amplifier module 108 a backing 158 resides adjacent a board 160. The board 160 is mounted upon the backing 158, may be a printed wiring board (PWB) or similar structure, and may include, among other electrical components, an MMIC 126. The board 160 may also include a DC connector 161 or other components that control power input to the MMIC 126. The MMIC 126 and board 160 are adjacent a cover 162. The MMIC 126 may be mounted upon the board 160 (e.g., when the MMIC is packaged with the board 160) and/or the backing 158. Mounting the MMIC 126 directly to the backing 158 may provide a better thermal communication path between the MMIC 126 and the backing 158. The cover 162 may insulate and/or secure the MMIC 126 on the MMIC power amplifier module 108.

The backing 158 may operate as a chassis formed of a thermally-conductive material such as light-weight aluminum and/or heavier copper. The backing 158 is an optional component that may be replaced by any other surface of one or more structures of the SSPA 100, such as the heat spreader 106, splitter 102, and/or combiner 104. The board 160 may be Rogers 4003 or 6002 material, a ceramic board, a microwave board, and/or a DC FR4 poly-board. The cover 162 may be formed of aluminum, zinc, liquid crystal polymer (LCP) to form a hermetic-like case, and/or a non-thermal plated plastic that operates as an RF shield. Other similar materials may be used as appropriate.

The backing 158 may provide a thermal path between the MMIC 126 and the heat spreader 106. It is important, but not necessary, that the backing 158 be placed into direct contact with the heat spreader 106, as doing so it will provide the shortest thermal path between the MMIC 126 and the heat spreader 106. The backing 158, the board 160, and/or any other portion of the MMIC power amplifier module 108, may include an RF waveguide feed 124 for receiving RF signals from a corresponding RF signal output 116 (FIG. 1) and/or may include an RF waveguide launch 128 for sending RF signals to a corresponding RF signal input 134 (FIG. 1). The backing 158, board 160, and/or cover 162 may include one or more attachment features 164 such as holes for securing each respective component of the backing 158, board 160, and/or cover 162 to each other and/or to other structures within the SSPA 100. For example, the multiple holes 164 on the cover 162 may house screws that secure the cover 162 to the board 160 and/or backing 158. As another example, the multiple holes 164 on the backing 158 may secure the entire MMIC power amplifier module 108 to both the RF waveguide splitter 102 and combiner 104 as shown and described in FIG. 10 and/or to the heat spreader 106.

Each MMIC power amplifier module 108 may be manufactured independent of any other module 108. Thus, a set of four MMIC power amplifier modules 108 need not be assembled as a single piece. By assembling and/or manufacturing each module 108 independent of any other, the manufacturability and scalability of the SSPA 100 is increased. For example, the SSPA 100 may include more than eight MMIC power amplifier modules 108 within the SSPA 100. In this instance, a manufacturer need only provide additional MMIC power amplifier modules 108 along with a correspondingly-sized heat spreader 106 and waveguide split block 144. Thus, the scale of the SSPA 100 may be easily changed using separate MMIC power amplifier modules 108. The manufacturer may choose to combine more or less of the MMIC power amplifier modules 108 to achieve more or less output power for the SSPA 100. As indicated above, by increasing or decreasing the total number of MMIC power amplifier modules 108, the split block 144, heat spreader 106, and housing 110 and 140 would need to be scaled appropriately to be scaled to accommodate the scale of modules 108.

Further, the manufacturing yield of separate MMIC power amplifier modules 108 will be improved since each module 108 can be screened or tuned before and/or after being integrated into the SSPA 100. For modules 108 which need to be replaced and/or repaired after being integrated into the SSPA 100, a manufacturer may replace or repair that single module 108 without having to replace or repair the remaining modules 108 on a given plane of the SSPA 100. For example, a manufacturer may replace and/or repair all or a portion of a single module 108 by removing the module 108 from the split block 144 or removing the cover 162 of the module 108. After the cover 162 of the module is removed, the manufacturer can access, trouble shoot, tune, add to, remove from, and/or rework all of the electronics within the module 108 to obtain optimum SSPA 100 performance while the remainder of the module 108 is attached to the split block 144.

In other examples of an SSPA 100, each MMIC power amplifier module 108 may include multiple MMIC's 126. Providing multiple MMIC's 126 on a single MMIC power amplifier module 108 will enable a manufacturer to reduce the number of MMIC power amplifier modules 108 within the SSPA 100. Since each MMIC power amplifier module 108 may require additional space for screws, backings, and/or other mechanical and/or electrical connections, by reducing the number of MMIC power amplifier modules 108 within an SSPA 100, the total volume of the SSPA 100 should also be reduced. For example, an SSPA 100 may include only two MMIC power amplifier modules 108 on opposite sides of the SSPA 100, with each MMIC power amplifier module 108 having between two and sixteen MMIC's 126. Further, each MMIC power amplifier module 108 may have an additional driver MMIC in series with one or more power amplifier MMIC's 126, in order to increase the overall gain of the MMIC's 126.

Figure 12:
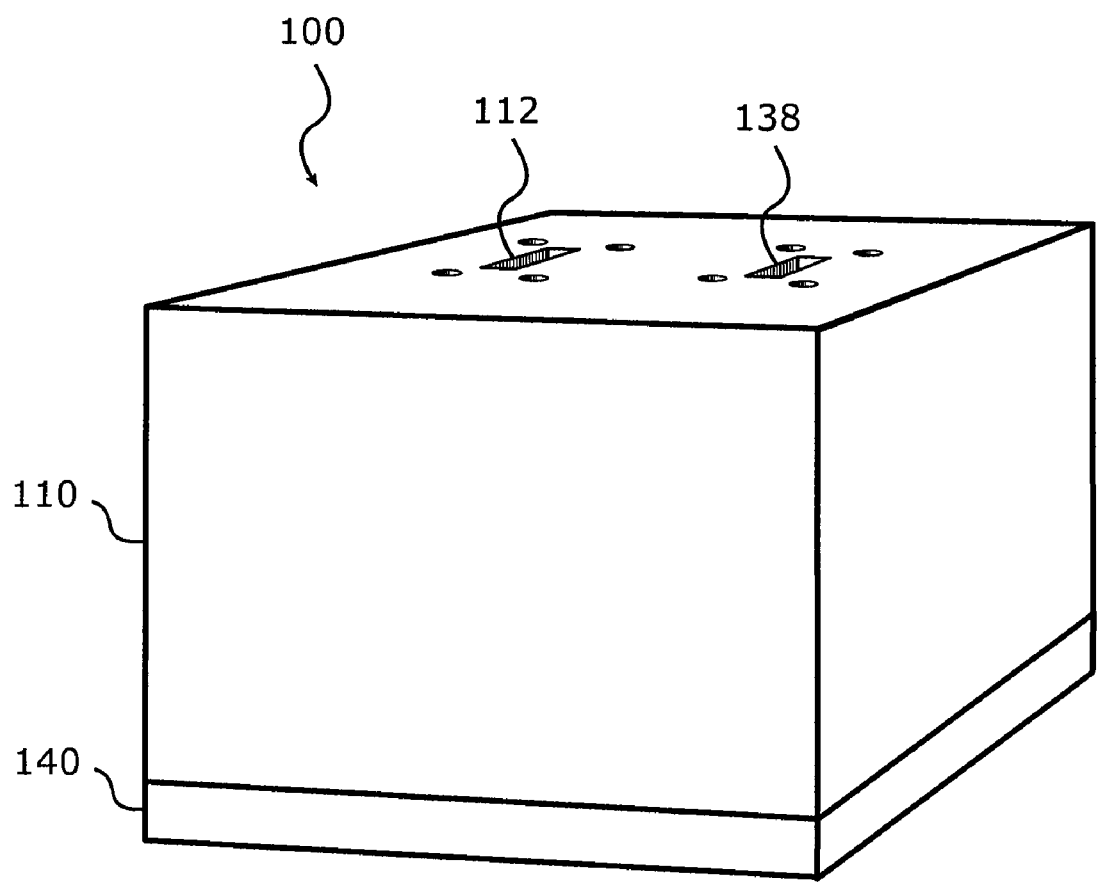
FIG. 12 shows a perspective view of an example of an SSPA.

Referring to FIG. 12, an example of an embodiment of an SSPA 100 is shown with a cover 110 mounted to a base 140. The cover 110 includes an RF signal input 112 and an RF signal output 138 on its top surface. The RF signal input 112 corresponds with the location of the RF signal input 112 of the RF waveguide splitter 102 described with reference to FIG. 10. Similarly, the RF signal output 138 corresponds in location with the RF signal output 138 of the RF waveguide combiner 104 described with reference to FIG. 10. The RF signal input 112 and output 138 may be located on any surface of the SSPA 100 as desired for a particular implementation. For example, although the input 112 and output 138 interfaces are both shown on the top side in FIG. 12, different routing within the split block 144 would allow the input 112 and/or output 138 to be routed through the bottom of the SSPA 100, that is through the base 140. With additional straight through waveguide split block pieces, the input 112 and/or output 138 could be routed to the front, back, right, and/or left sides of the cover 110. Inputs 112 and/or outputs 138 which extend through the sides of the cover 110 may be used in combination with a two piece cover 110 to increase access for attaching the additional input 112 and output 138 waveguide pieces.

Figure 13:
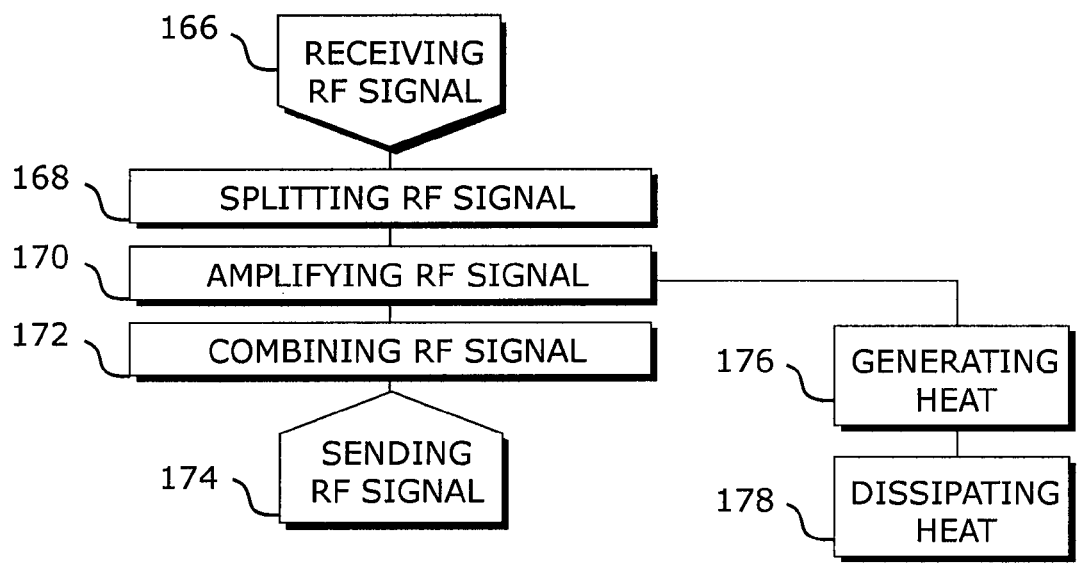
FIG. 13 shows a flow diagram of an example of a method for dissipating heat within an SSPA.

Referring to FIG. 13, a method of using an SSPA 100 may include the following steps: receiving and/or inputting an RF signal 166, splitting the RF signal 168, amplifying the RF signal 170, combining the RF signal 172, and sending or outputting the RF signal 174. Additionally, the method may include generating heat 176 while amplifying the RF signal 170 and then dissipating the heat 178. Receiving and/or inputting the RF signal 166 may occur through an RF signal input 112. Splitting the RF signal 168 may include splitting the RF signal into multiple RF signals with outputs along two planes, such as into the first plane 150 and the second plane 152 with reference to FIG. 6. Amplifying the RF signal 170 may include amplifying multiple RF signals with multiple MMIC's 126 arranged along two separate planes, for example, as described with reference to FIG. 10. Combining the RF signal 172 may include combining the multiple amplified RF signals from multiple RF signal inputs 134 into fewer RF signals, such as a single RF signal to be sent to RF signal output 138. The combining may occur in a separate plane from the splitting. Generating heat 176 may include generating heat from multiple MMIC's 126 while amplifying the multiple RF signals. Dissipating heat 178 may include dissipating heat that is generated from the two separate planes of MMIC power amplifier modules 108 into a single heat spreader 106. Dissipating heat 178 may also include dissipating the heat into one or more heat spreaders 106 having one or more fluid spaces 132 into which the heat may be further dissipated.

Figure 14:
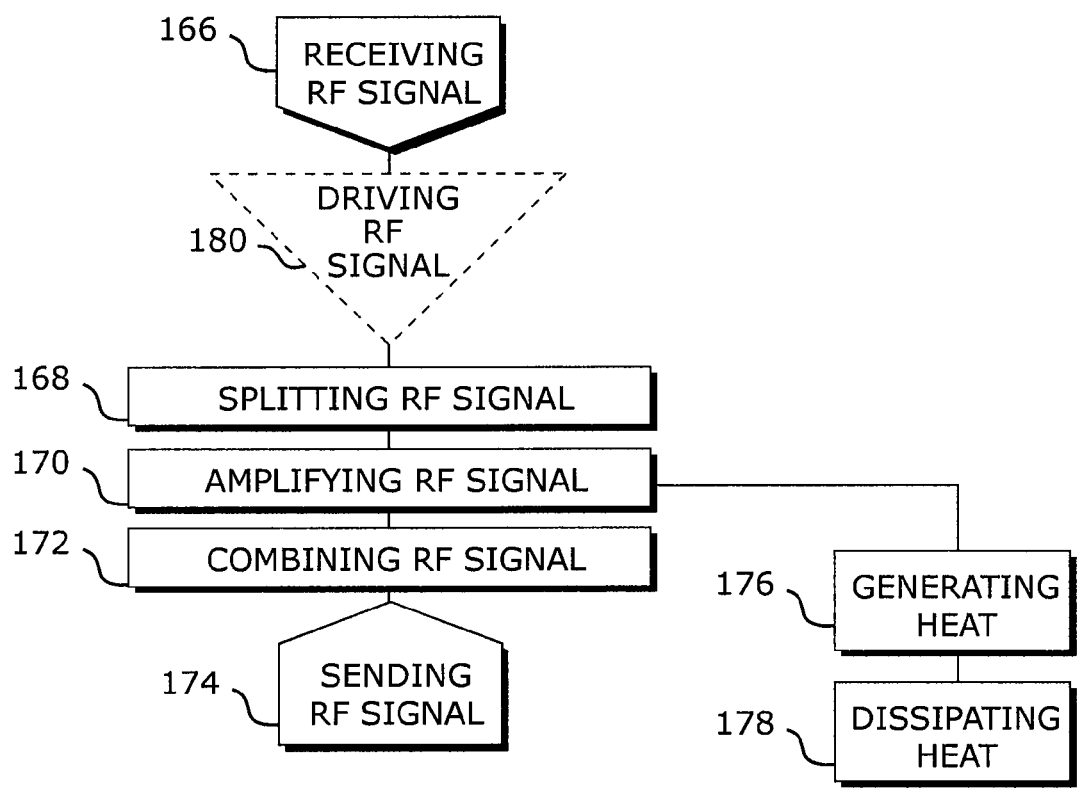
FIG. 14 shows a flow diagram of an example of a method of dissipating heat within an SSPA where the method includes driving an RF signal.
Figure 15:
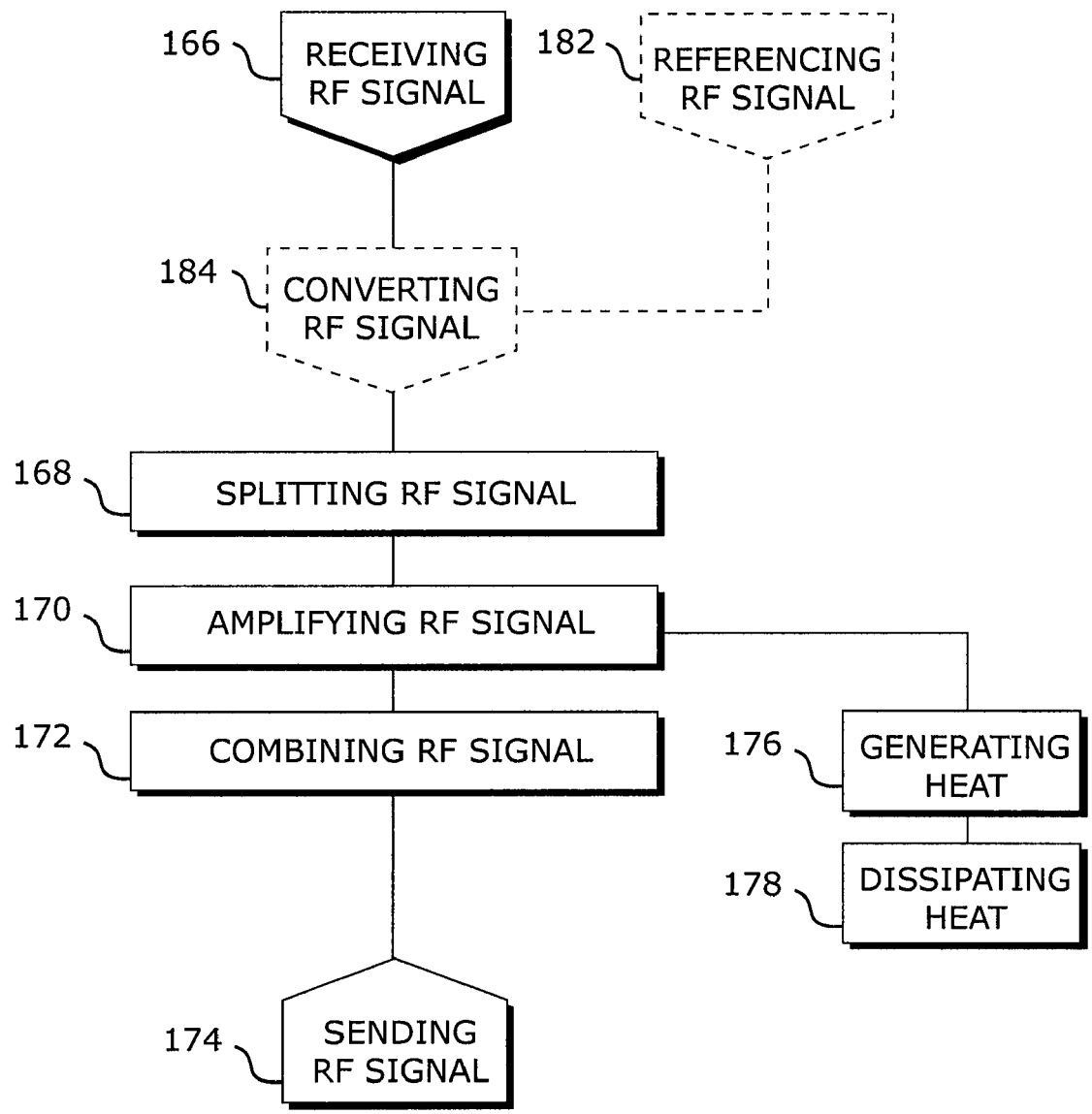
FIG. 15 shows a flow diagram of an example of a method of dissipating heat where the method includes referencing an RF signal and converting an RF signal.

Referring to FIG. 14, the method described with reference to FIG. 13 may be modified to include the step of driving the power of the RF signal 180 after the step of receiving an RF signal 166. Referring to FIG. 15, the method described with reference to FIG. 13 may be modified to include the steps of referencing the RF signal 182 and then converting the RF signal 184 after the step of receiving an RF signal 166. Alternatively or additionally, the method may include the steps of referencing an IF signal and then converting the IF signal to an RF signal.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. A solid state amplifier system comprising:
    an radio frequency (RF) waveguide split block including an RF waveguide splitter and an RF waveguide combiner, wherein the RF waveguide splitter is in communication with an RF input;
    a first monolithic microwave integrated circuit (MMIC) arranged in a first plane and a second MMIC arranged in a second plane, wherein the first plane is not coplanar with the second plane, and wherein the first MMIC and the second MMIC are placed in communication with the RF waveguide split block; and
    a heat spreader having a first surface and a second surface, wherein the first surface is in thermal communication with the first MMIC, wherein the second surface is in thermal communication with the second MMIC, and wherein the first surface is in a different plane than the second surface.

2. The system of claim 1, wherein the first MMIC is part of a first power amplifier module, and the second MMIC is part of a second power amplifier module, wherein the first power amplifier module is in contact with the first surface of the heat spreader and wherein the second power amplifier module is in contact with the second surface of the heat spreader.

3. The system of claim 2, wherein the first and second power amplifier modules are power combined to each other through the RF waveguide split block.

4. The system of claim 3, wherein each of the first and second power amplifier modules includes an RF feed and an RF launch, wherein the RF waveguide splitter includes first and second splitter outputs that each send RF signals to the corresponding RF feed of the respective first and second power amplifier modules, and wherein the RF waveguide combiner includes first and second combiner inputs that each receive RF signals from the corresponding RF launch of the corresponding first and second power amplifier modules.

5. The system of claim 4, wherein the RF waveguide splitter splits at least one RF signal into four to thirty-two separate RF signals, and wherein the RF waveguide combiner combines four to thirty-two separate RF signals into at least one RF signal.

6. The system of claim 4, further comprising an electromagnetic interference cover over the RF waveguide split block, the first and second power amplifier modules, and the heat spreader, wherein the heat spreader communicates with at least one fluid space, wherein the first power amplifier module includes a first printed wiring board (PWB) attached to the first MMIC, and wherein the second power amplifier module includes a second PWB attached to the second MMIC.

7. A solid state amplifier comprising:
a heat spreader having first, second, third, and fourth surfaces along different planes;
a first monolithic microwave integrated circuit (MMIC) in thermal communication with the second surface of the heat spreader; and
a second MMIC in thermal communication with the third surface of the heat spreader;
wherein the first MMIC is part of a first power amplifier module that is in contact with said second surface of the heat spreader, and wherein the second MMIC is part of a second power amplifier module that is in contact with the third surface of the heat spreader.

8. The solid state amplifier of claim 7, wherein the first and second power amplifier modules each comprise:
a backing;
a printed wiring board mounted upon the backing; and
a cover at least partially covering at least one of the first and second MMIC;
wherein the backing provides a thermal path from at least one of the first and second MMIC to the heat spreader;
wherein the backing includes a radio frequency (RF) waveguide feed for receiving RF signals; and
wherein the backing includes an RF waveguide launch for sending RF signals.

9. The solid state amplifier of claim 7, wherein the surfaces of the heat spreader, including at least the first, second, third, and fourth surfaces, together form an exterior prism shape for the heat spreader.

10. The solid state amplifier of claim 9, wherein the exterior prism shape is one of a rectangular prism, a cubic prism, a hexagonal prism, a parallelogram prism, and an octagonal prism.

11. The solid state amplifier of claim 7, wherein the first and second MMIC are in direct contact with the backing.

12. The solid state amplifier of claim 7, wherein the first and second power amplifier modules individually communicate with an RF waveguide splitter and an RF waveguide combiner.

13. A method for amplifying a radio frequency (RF) signal within a solid state amplifier, the method comprising:
receiving an RF signal;
splitting the RF signal into multiple RF signals and outputting a first set of the multiple RF signals for use in a first plane and outputting a second set of the multiple RF signals for use in a second plane;
amplifying the first set of the multiple RF signals with a first amplifier component located in the first plane and amplifying the second set of the multiple RF signals with a second amplifier component located in the second plane,
combining the first and second sets of the multiple RF signals in a different plane than the plane used for splitting the RF signal; and
dissipating heat from the first amplifier component and second amplifier component into a single heat spreader.

14. The method of claim 13, wherein said solid state amplifier is a solid state power amplifier.

15. The method of claim 14, further comprising:
dissipating the heat in the single heat spreader into a fluid space, and
converting a signal between an intermediate frequency (IF) signal and an RF signal.

16. The method of claim 13, wherein the first and second amplifier components each comprise at least one monolithic microwave integrated circuit (MMIC).

17. A three dimensional solid state amplifier comprising:
a radio frequency (RF) signal splitter in a first plane;
an RF signal combiner in a second plane; and
a first amplifier component in a third plane and a second amplifier component in a fourth plane, wherein each of said first and second amplifier components comprises active components configured to amplify an RF signal;
wherein the RF signal splitter is connected in communication with the first and second amplifier components;
wherein the RF signal combiner is connected in communication with the first and second amplifier components; and
wherein the first, second, third, and fourth planes are arranged about a central axis, and parallel to the central axis.

18. The three dimensional solid state amplifier of claim 17, wherein the central axis is defined by the intersection of a perpendicular plane from the middle of each of the RF signal splitter, the RF signal combiner, the first amplifier component and the second amplifier component.

19. The three dimensional solid state amplifier of claim 17, wherein a heat spreader has an exterior shape of a prism, wherein a prism is a three dimensional figure that has multiple sides and has two parallel and congruent bases in the shape of polygons, and wherein the RF signal splitter, the RF signal combiner, the first amplifier component and the second amplifier component are arranged about the multiple sides of the prism.

* * * * *